United States Patent
Okita

(10) Patent No.: US 6,181,634 B1
(45) Date of Patent: Jan. 30, 2001

(54) MULTIPLE-PORT SEMICONDUCTOR MEMORY DEVICE

(75) Inventor: Munehisa Okita, Kanagawa (JP)

(73) Assignee: NEC Corporation, Tokyo (JP)

(*) Notice: Under 35 U.S.C. 154(b), the term of this patent shall be extended for 0 days.

(21) Appl. No.: 09/493,155

(22) Filed: Jan. 28, 2000

(30) Foreign Application Priority Data

Jan. 29, 1999 (JP) ................................. 11-021712

(51) Int. Cl.$^7$ .................................................. G11C 8/00
(52) U.S. Cl. .......................... 365/230.05; 365/189.04; 365/194; 365/233; 365/189.07
(58) Field of Search ................... 365/230.05, 189.04, 365/233, 189.07, 194

(56) References Cited

U.S. PATENT DOCUMENTS

| | | | |
|---|---|---|---|
| 4,789,960 | * 12/1988 | Willis | 365/189 |
| 5,036,491 | * 7/1991 | Yamaguchi | 365/189.07 |
| 5,197,035 | * 3/1993 | Ito | 365/230.05 |
| 5,321,652 | * 6/1994 | Ito | 365/189.07 |
| 5,325,332 | * 6/1994 | Tagaya | 365/200 |

FOREIGN PATENT DOCUMENTS 1-285088   11/1989  (JP).

\* cited by examiner

*Primary Examiner*—Son T. Dinh
*Assistant Examiner*—Tuan T. Nguyen
(74) *Attorney, Agent, or Firm*—Young & Thompson

(57) ABSTRACT

A dual-port SRAM operates for read and write operations in a single clock cycle. The SRAM has a comparator for comparing the read address and the write address to detect a coincidence therebetween. A bypass circuit bypasses the write data as a read data upon detection of a coincidence, whereas a timing circuit delays the write control signal with respect to the read control signal upon detection of no coincidence. The timing control between the read operation and the write operation reduces signal interference between the write data and the read data and enables a higher speed operation of the computer system.

8 Claims, 10 Drawing Sheets

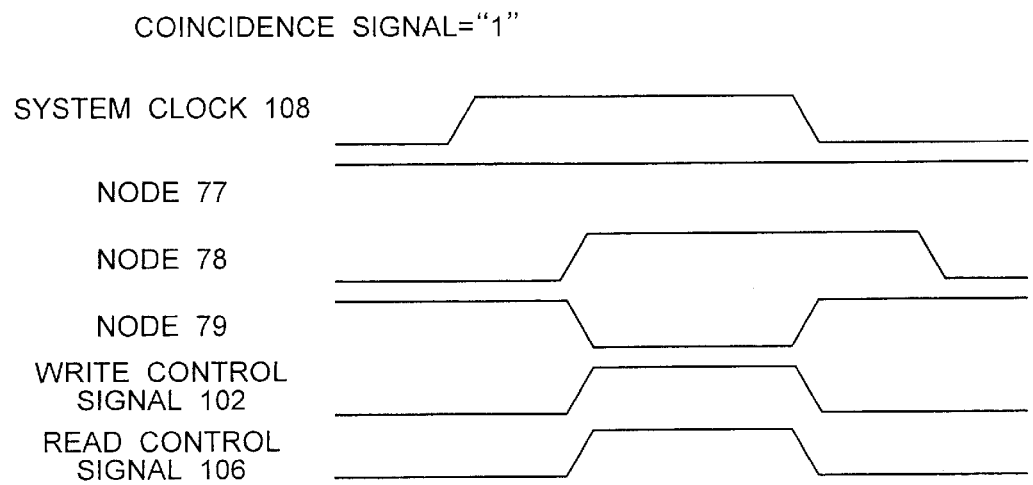
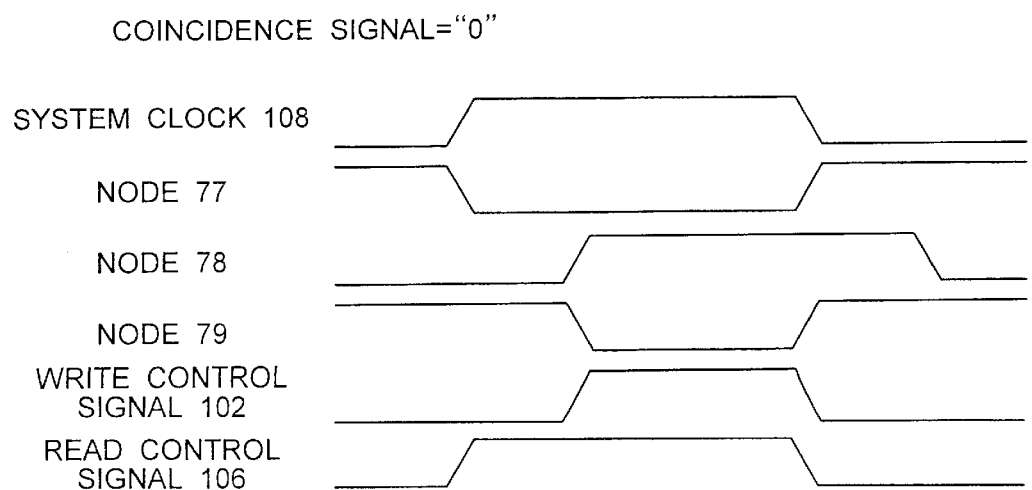

MULTIPLE-PORT SEMICONDUCTOR MEMORY DEVICE

BACKGROUND OF THE INVENTION (a) Field of the Invention

The present invention relates to a multiple-port semiconductor memory device and, more particularly, to a multiple-port semiconductor memory device, wherein a pair of data, for example, are concurrently read from and written in the memory cell array through an input port and an output port. The present invention also relates to a method for controlling such a-multiple-port semiconductor memory device.

(b) Description of a Related Art

A multiple-port SRAM, typically known as a dual-port SRAM, is generally incorporated as a core macro-block in a LSI. In the general dual-port SRAM, if data are to be read from and written in a single memory cell (or the same address), both the read and write operations are conducted concurrently as in the case of different addresses. In this situation, the read data changes during the read operation from the old data, stored in the memory cell before the write operation, to the new data written into the memory cell after the write operation. This is not preferable because the read data cannot be determined depending on the timing of the read-out.

For solving the above problem, another configuration is also used wherein the write data is first stored in the memory cell and then read therefrom as a read data. However, this operation consumes a larger read time compared to the ordinary read operation in a SRAM. In the dual port SRAM, it is desired that the read and write operations be conducted independently of each other at a higher-speed, especially for the read operation.

For responding to the above request, Patent Publication JP-A-1-285088 proposes a dual-port memory device such as shown in FIG. 1. In the proposed device, the write data 101 supplied through the input port is bypassed to the output port through a bypass circuit 19 if the read and write operations are to be performed to a single memory cell, wherein both the read address and the write address coincide with each other. This configuration achieves a higher-speed read operation, which is comparable to the read time for the ordinary read operation in a SRAM.

In the mean time, some current dual-port memory device used as a memory macro-blocks includes an input port for the write data and an output port for the read data which are located opposite to each other with the memory cell array sandwiched therebetween. This configuration responds to the request for the increase of the number of bits, or adapts to the structure of a system-on-chip LSI from the view point of chip design. In the system-on-chip LSI, it is desired that the data terminals of the memory macro-block be separated between the input side and the output side thereof. If the bypass circuit shown in FIG. 1 is incorporated into this type of dual-port memory device, the circuit configuration may be such that shown in FIG. 2. FIG. 3 shows a timing chart of the dual-port SRAM of FIG. 2.

In FIG. 3, a timing section 22 of FIG. 2 generates a read control signal 106 and a write control signal 102 in synchrony with a system clock signal 108 for controlling the input section 16 and the output section 18. When a comparator (or a coincidence detection section) 17 detects a coincidence between the write address and the read address to generate a coincidence signal 107, the coincidence signal 107 is delivered to the bypass circuit 19, which bypasses the write data 101 to the output port as a read data in the clock cycle. In this case, the read operation is conducted at a speed comparable with the speed of the ordinary read operation.

On the other hand, if the write address and the read address do not coincide with each other, the read and write operations are performed to different memory cells independently of each other. In general, the memory cell array has a pair of complementary read bit lines 20 and a pair of complementary write bit lines 21, with the arrangement such that a non-inverting write bit line and an inverting read bit line are disposed adjacent to each other and an inverting write bit line and a non-inverting read bit line are disposed adjacent to each other. This configuration involves a problem wherein a signal interference occurs between the write data and the read data concurrently appearing on the read bit lines 20 and the write bit lines 21, respectively. The signal interference delays the read data supplied through the read bit lines 20 compared to the ordinary read operation in a SRAM. This problem is enhanced by the reduction of the line space in the current dual-port SRAM, wherein a coupling capacitance is increased more and more between adjacent bit lines.

The above problem is specifically involved in the arrangement shown in FIG. 2, wherein the input port and the output port are opposed to each other with the memory cell array 11 sandwiched therebetween. In the conventional SRAM of FIG. 1, this is not the case because there is provided a timing difference between the read operation and the write operation, as shown in FIG. 4, wherein the read control signal 102 leads with respect to the write control signal 106.

SUMMARY OF THE INVENTION

In view of the above, it is an object of the present invention to provide a multiple-port SRAM capable of achieving a higher read operation irrespective of an absence or a presence of coincidence between the write address and the read address even in the case of the arrangement wherein the input port and the output port are opposed to each other with the memory cell array sandwiched therebetween.

The present invention provides a multiple-port memory device comprising a memory cell array including a plurality of memory cells, an input circuit for responding to a write control signal to store a write data to one of the memory cells specified by a write address during a clock cycle of a system clock signal, an output circuit for responding to a read control signal to read a data from one of the memory cells specified by a read address during the same clock cycle, a coincidence detection section for generating a coincidence signal upon coincidence between the read address and the write address, a bypass circuit for responding to the coincidence signal to bypass the write data to the output section, and a timing circuit for responding to the coincidence signal to specify a timing between the write control signal and the read control signal, the timing being such that the read control signal leads with respect to the write control signal upon an absence of the coincidence signal and that the read control signal and the write control signal are generated substantially at the same time upon a presence of the coincidence signal.

In accordance with the multiple-port SRAM of the present invention, the concurrent timing of the read control signal and the write control signal upon generation of the coincidence signal allows the bypass circuit to bypass the write data supplied from the input section to the output section, which deliver the write data as a read data. In addition, the delay of the write control signal enables the output section to read a data from the memory cell specified by the read address without interference between the read data and the write data on the bit lines. The delay of the storage of the write data upon the absence of the coincidence signal does not affect the speed of the computer system so long as the storage is completed in the clock cycle. The high-speed read operation enables the computer system having the dual-port memory device to operate at a higher speed. The timing control between the read control signal and the write control signal based on the coincidence signal is not known in the art.

The above and other objects, features and advantages of the present invention will be more apparent from the following description, referring to the accompanying drawings.

BRIEF DESCRIPTION OF THE DRAWINGS

FIGS. 12A and 12B are timing charts of the SRAM having the timing section of FIG. 11, showing cases similar to the cases of FIGS. 8A and 8B, respectively.

PREFERRED EMBODIMENTS OF THE INVENTION

Now, the present invention is more specifically described with reference to accompanying drawings.

Figure 1:
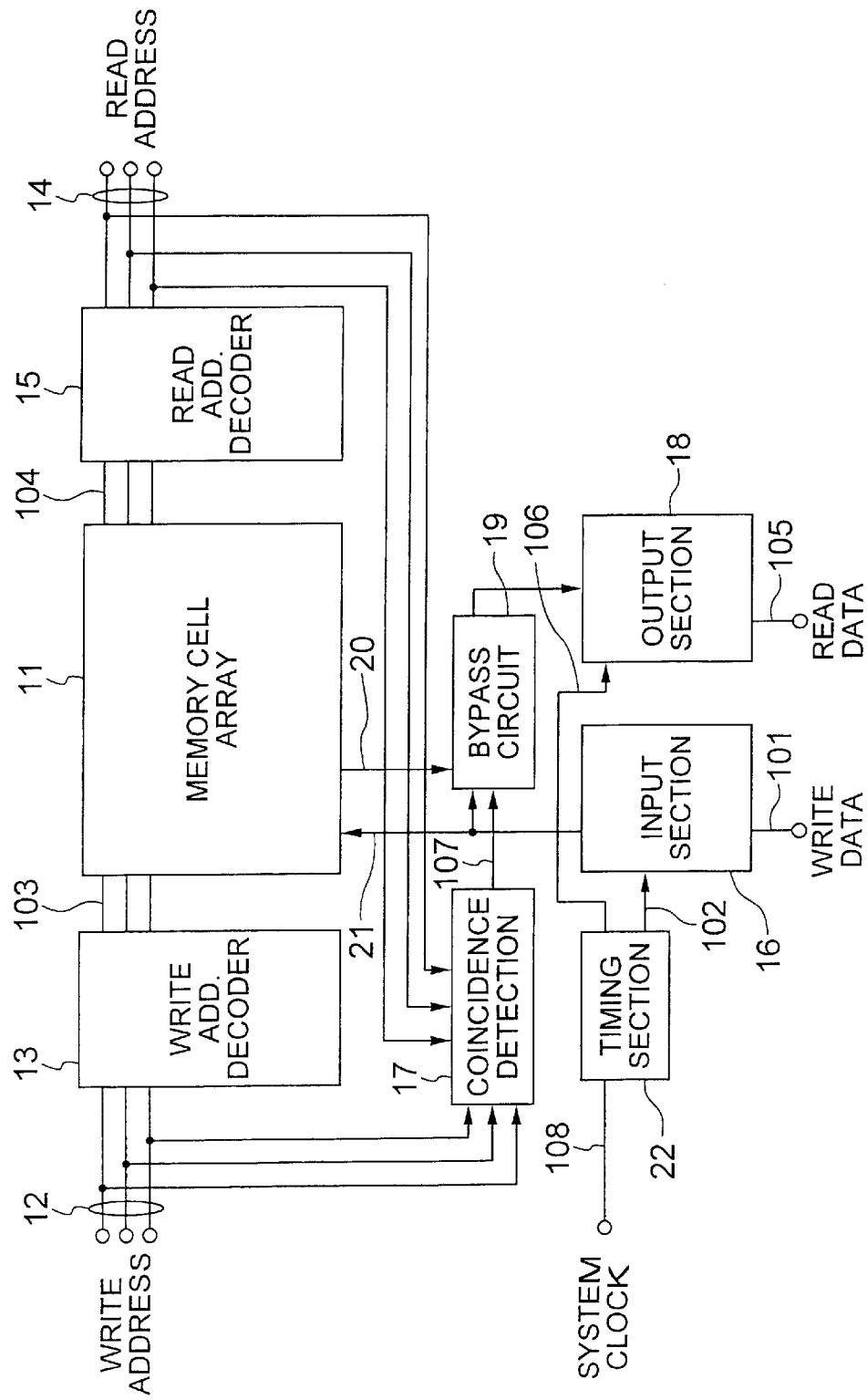
FIG. 1 is a block diagram of a conventional dual-port SRAM having a function proposed by a patent publication.
Figure 2:
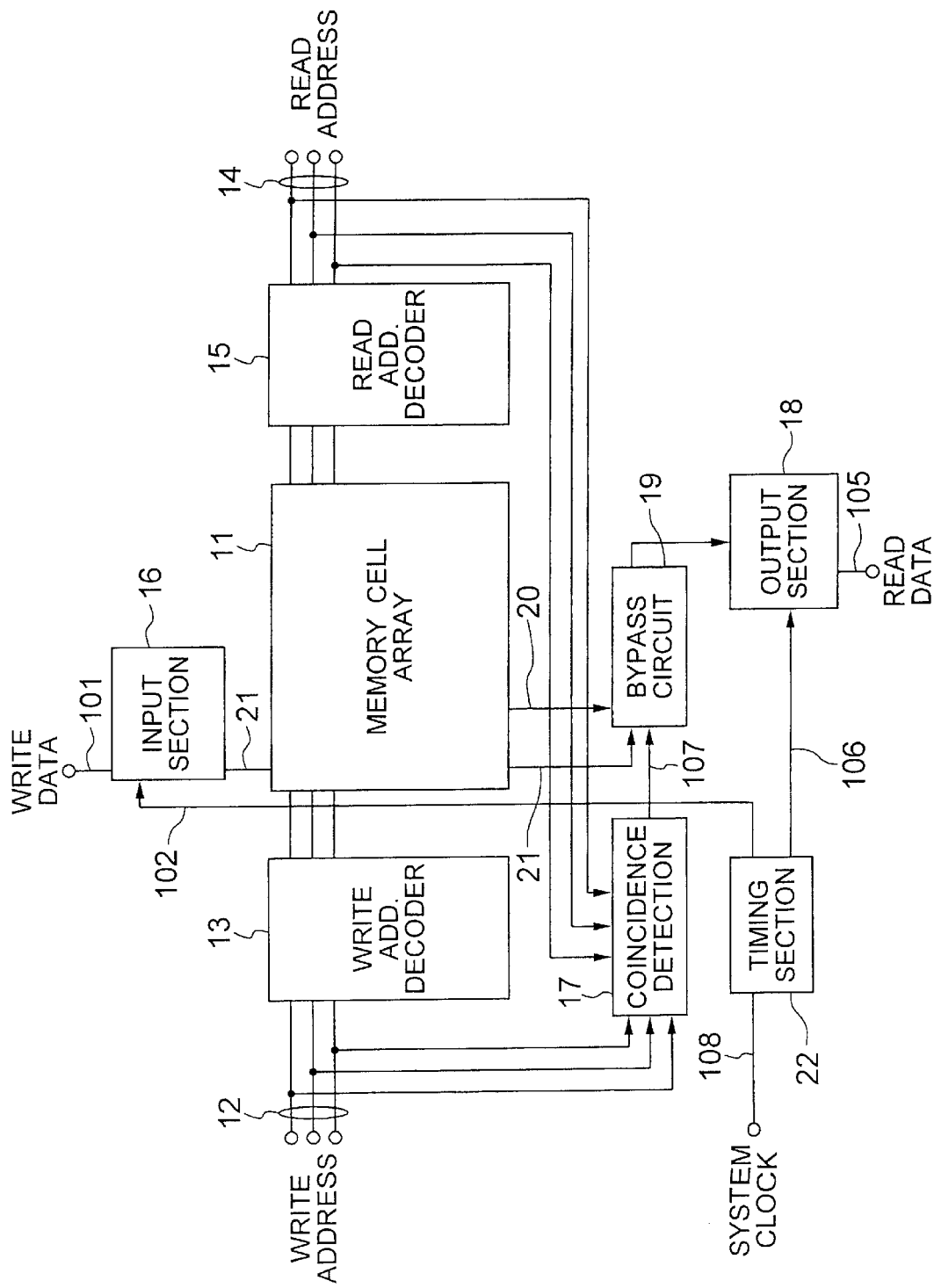
FIG. 2 is a block diagram of a conceivable dual-port SRAM having an ordinary structure and the function proposed by the publication.
Figure 3:
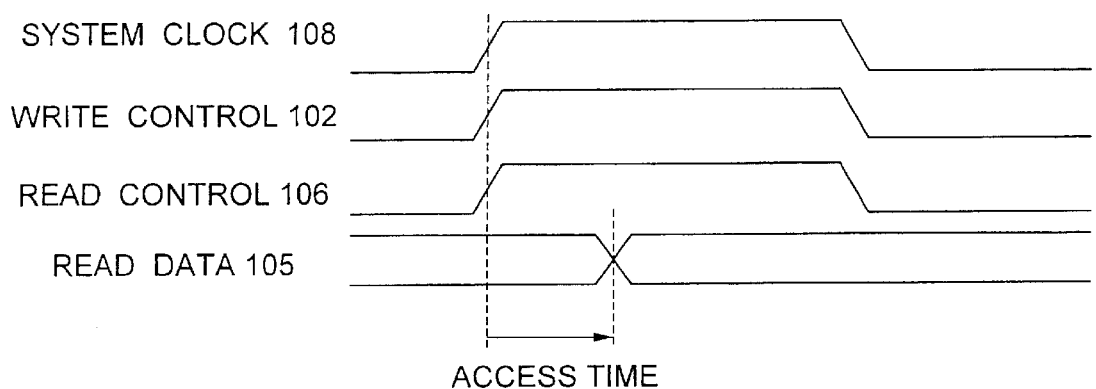
FIG. 3 is a timing chart of the conceivable dual-port SRAM of FIG. 2.
Figure 4:
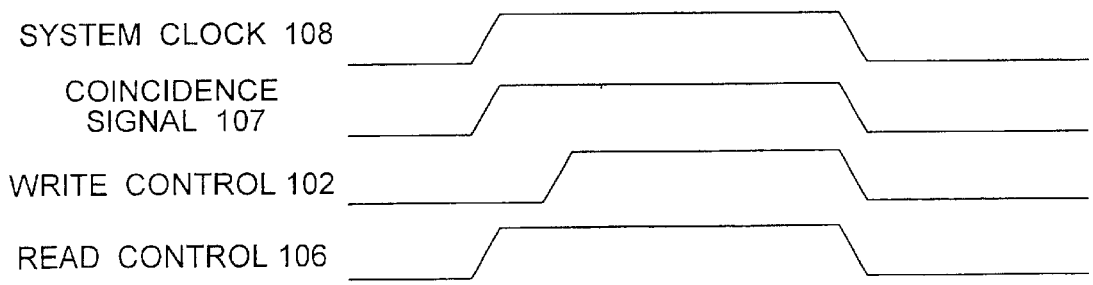
FIG. 4 is a timing chart of the dual-port SRAM of FIG. 1.
Figure 5:
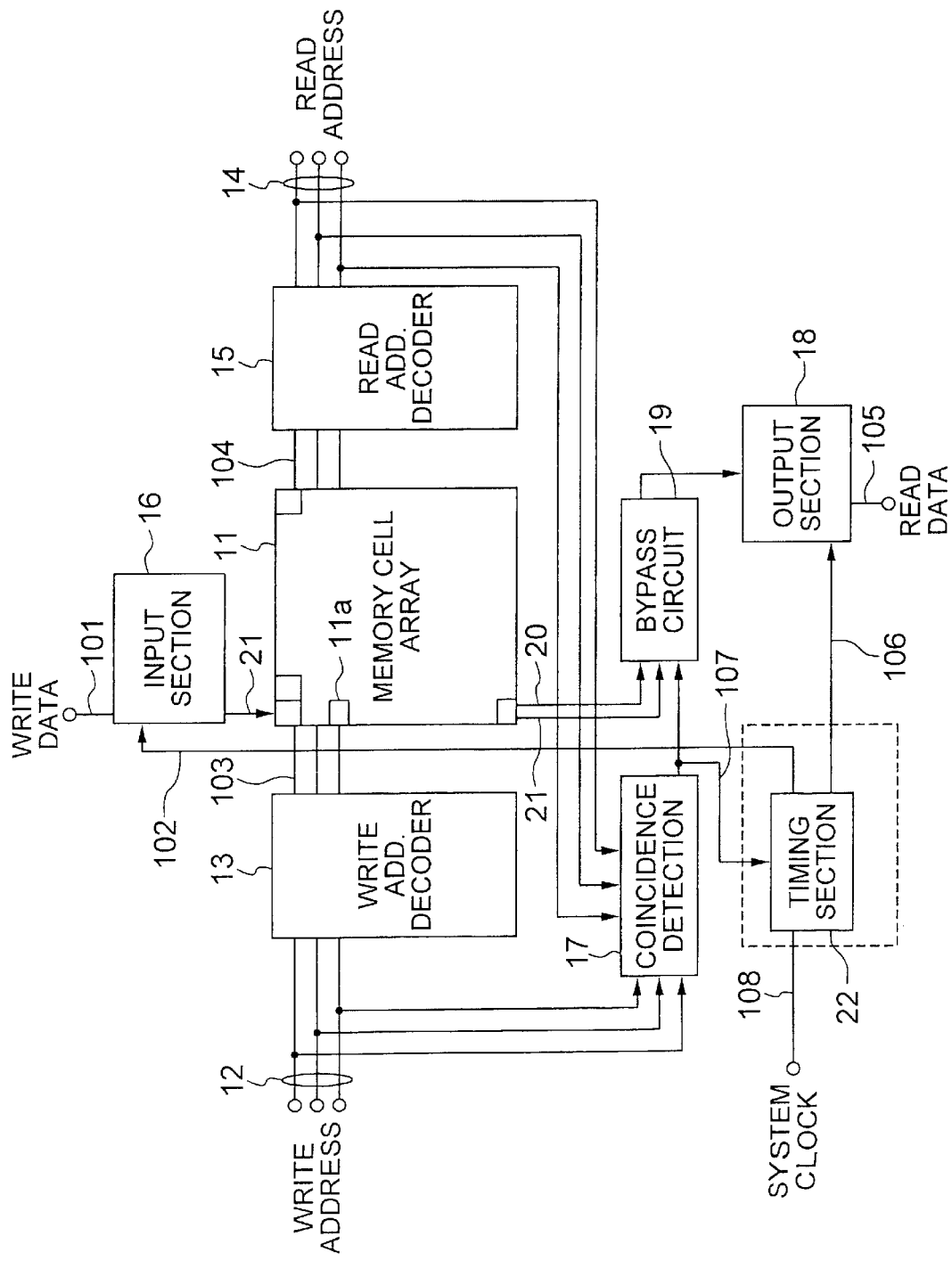
FIG. 5 is a block diagram of a dual-port SRAM as an example of the multiple-port SRAM according to the present invention.

Referring to FIG. 5, a dual-port SRAM according to an embodiment of the present invention includes a memory cell array 11 including a plurality of memory cells arranged in a matrix, a write address decoder 13 for receiving write address through an input port address bus 12, a read address decoder 15 for receiving a read address through an output port address bus 14, an input section 16 for receiving a write data 101 to store the write data to the memory cell array 11, an output section 18 for delivering a read data 105 read from the memory cell array 11, a coincidence detection section (comparator) 17 for comparing the write address and the read address to deliver a coincidence signal 107 which is active upon detection of a coincidence therebetween, a bypass section 19 for receiving the read data from the memory cell array 11 through a pair of read bit lines 20 to deliver the read data to the output section 18 in the case of an inactive level of the coincidence signal 107 and for responding to an active level of the coincidence signal 107 to bypass the write data supplied from a pair of write bit lines 21 to the output section 18, and a timing section 22 for receiving a system clock signal 108 and the coincidence signal 107 to generate and deliver a write control signal 102 and a read control signal 106 at a specified timing with respect to the system clock signal 108 depending on the coincidence signal 107. The input port for receiving the write data 101 and the output port for delivering the read data 105 are located opposite to each other, with the memory cell array 11 sandwiched therebetween.

Figure 6:
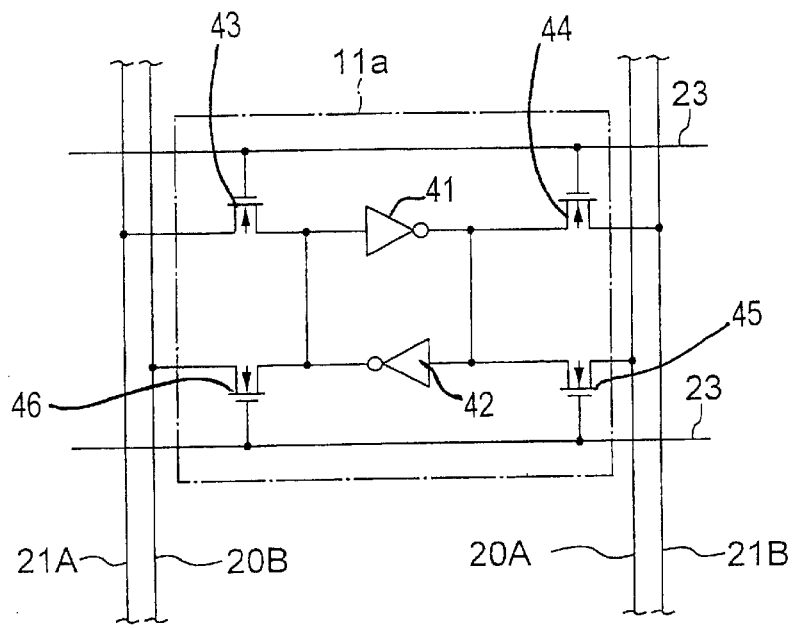
FIG. 6 is a detailed circuit diagram of one of the memory cells shown in FIG. 5.

Referring to FIG. 6 showing a detail of a portion of the memory cell array 11, the memory cell array 11 includes a plurality of memory cells 11a one of which is shown therein, a pair of word lines 23 disposed for each row of the memory cells 11a, and a set of bit lines disposed for each column of the memory cells 11a. The set of bit lines includes a pair of complementary read bit lines 20A and 20B and a pair of complementary write bit lines 21A and 21B. Each memory cell 11a includes a latch section composed of a pair of inverters 41 and 42 connected together to form a latch loop for storing a cell data, a pair of write transfer transistors 43 and 44 each for receiving the write data from a corresponding one of the write bit lines 21A and 21B for storage of the write data in the latch section, and a pair of read transfer transistors 45 and 46 each for delivering the data stored in the latch section to a corresponding one of the read bit lines 20A and 20B.

The non-inverting write bit line 21A and the inverting read bit line 20B are disposed adjacent to each other to have a large coupling capacitance therebetween, whereas the inverting write bit line 21B and the non-inverting read bit line 20A are disposed adjacent to each other to have a large coupling capacitance therebetween. The large coupling capacitance retards a high-speed signal transmission if both the write bit line pair 21 and the read bit line pair 20 concurrently transfer respective data.

Figure 7:
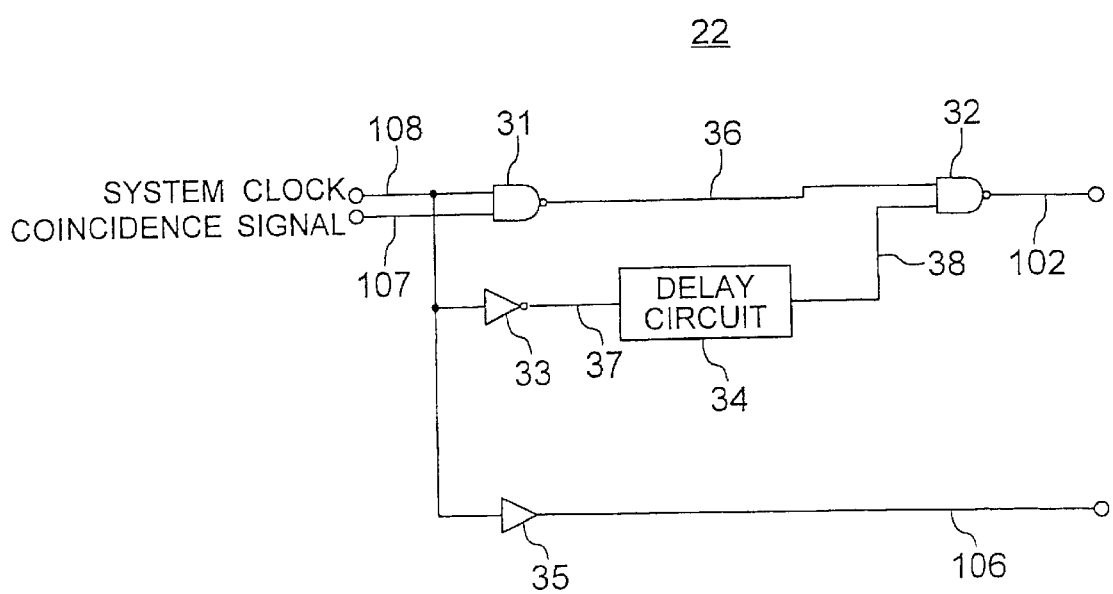
FIG. 7 is a circuit diagram of a first example of the timing section shown in FIG. 5.

Referring to FIG. 7, a first example of the timing section 22 includes a first NAND gate 31 for receiving at the inputs thereof the system clock signal 108 and the coincidence signal 107, an inverter 33 for inverting the system clock signal 108, a delay circuit 34 for receiving an output from the inverter 33 to deliver a delayed output signal, a second NAND gate 32 for receiving at the inputs thereof outputs from the first NAND gate 31 and the delay circuit 34 to deliver the write control signal 102, and a buffer for receiving the system clock signal 108 to deliver the read control signal 106.

Figure 8A:
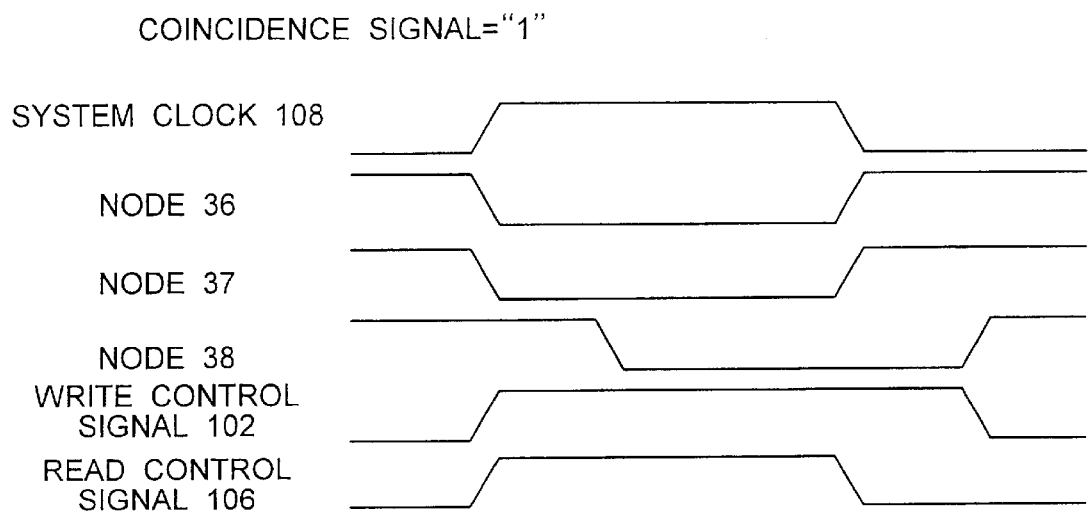
FIGS. 8A and 8B are timing charts of the SRAM having the timing section of FIG. 7, FIG. 8A corresponding to the case wherein both the write address and the read address coincide with each other, FIG. 8B corresponding to the case wherein both the write address and the read address do not coincide with each other.
Figure 8B:
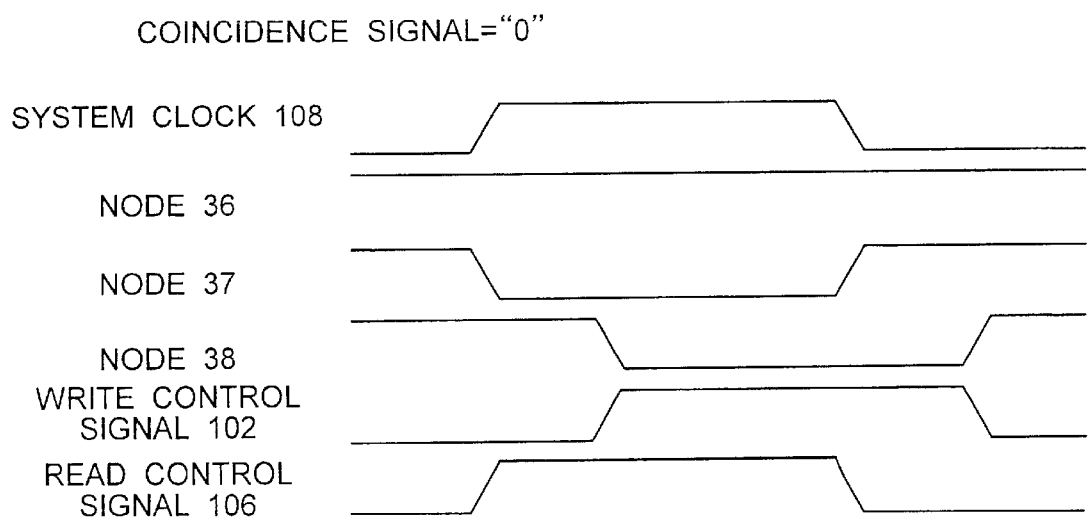

Referring to FIGS. 8A and 8B, there are shown timing charts of the timing section 22 in the cases of a presence and an absence, respectively, of the coincidence between both the read address and the write address.

In FIG. 8A, when the clock signal 108 rises to a high level with the coincidence signal set at "1", node 36 and the output of buffer 35 falls to a low level at the same time, whereby the write control signal 102 and the read control signal 106 rise to an active high level at the same time. Node 38 falls to a low level after a specified delay time elapsed since node 37 falls to a low level.

The write control signal 102 and the read control signal 106 delivered in synchrony with the system clock signal 108 allow the input section 16, the output section 18 and the bypass section 19 to operate in association at the initial stage of the clock cycle, whereby the bypass section 19 transfers the write data from the input section 16 to the output section 18 and thus the output section 18 can deliver the write data as a read data at the initial stage of the clock cycle.

On the other hand, if the clock signal 108 rises to a high level with the coincidence signal reset at "0", as shown in FIG. 8B, node 36 remains at a high level and the output of the buffer 35 falls to a low level. Thus, the read control signal 106 rises to an active high level in synchrony with the system clock signal 108. Node 38 falls to a low level after the specified time delay elapsed since the fall of node 37, whereby the write control signal 102 rises to an active high level with a specified time delay.

More specifically, when the write address and the read address do not coincide with each other, the timing section 22 first delivers the read control signal 106 and then delivers the write control signal 102 with the specified time delay. In this case, the bypass section 19 receives an inactive level of the coincidence signal to select the read data read from the memory cell array 11 through the read bit lines 20 to thereby deliver the read data to the output section 18. Thus, the output section 18 delivers the data read from the memory cell array as a read data. The write operation is conducted by the input section 16 after the read operation is finished due to the delay of the write control signal 102. In this case, the read operation is conducted at a high speed without a coupling delay because the read and write operations are performed separately.

In the above operations, it is to be noted that the read data is essentially transferred to the succeeding-stage macroblock in the LSI during the read/write operation The read operation should be conducted in the initial stage of the clock cycle for assuring the signal transmission and the safe reception of the read data by the succeeding macro-block in the rest of the clock cycle In this respect, it is sufficient that the write operation is finished before the end of the clock cycle because the memory macro-block is the destination for the write data, which does not involve any operation by another macro-block. That is, the write operation may be delayed with respect to the read operation so long as it is finished in the clock cycle.

In the above embodiment, the timing control by the timing section 22 based on the coincidence signal 107 allows a higher-speed transmission of the read data irrespective of the active or inactive level of the coincidence signal 107.

Figure 9:
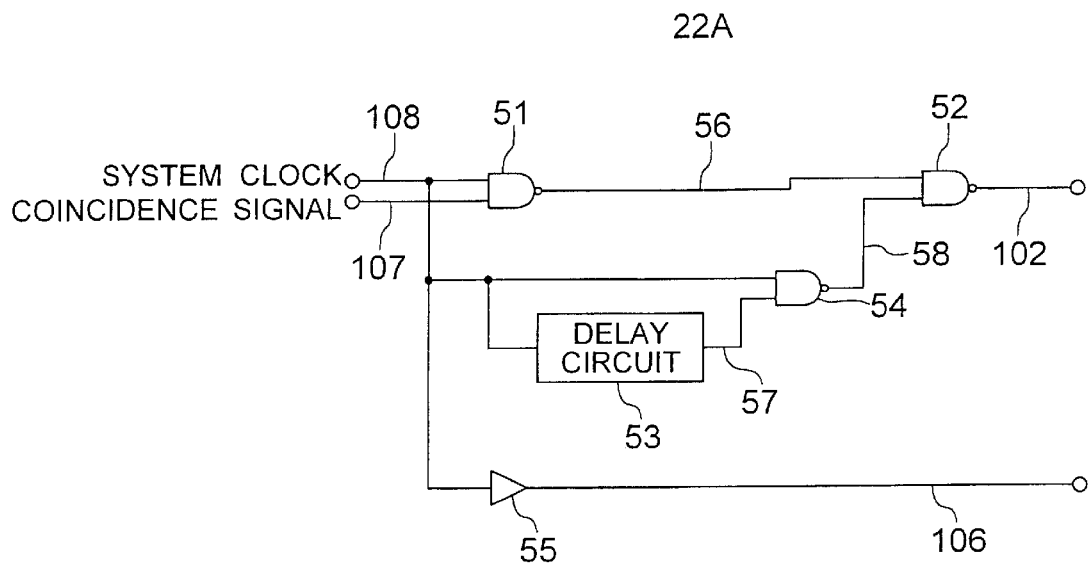
FIG. 9 is a circuit diagram of a second example of the timing section shown in FIG. 5.

Referring to FIG. 9, a second example of the timing section shown in FIG. 5 is different from the first example in that a third NAND gate is provided in the present example in place of the inverter in FIG. 5. More specifically, the timing section 22A includes a first NAND gate 51 for receiving at the inputs thereof the system clock signal 108 and the coincidence signal 107, a second NAND gate 52 for receiving at the inputs thereof outputs from the first NAND gate 51 and the third NAND gate 54, a delay circuit 53 for receiving the system clock signal 108 to deliver a delayed clock signal, the third NAND gate 54 for receiving at the inputs thereof the system clock signal 108 and the delayed clock signal, and a buffer 55 for receiving the system clock signal 108 to deliver a read control signal 106.

Figure 10A:
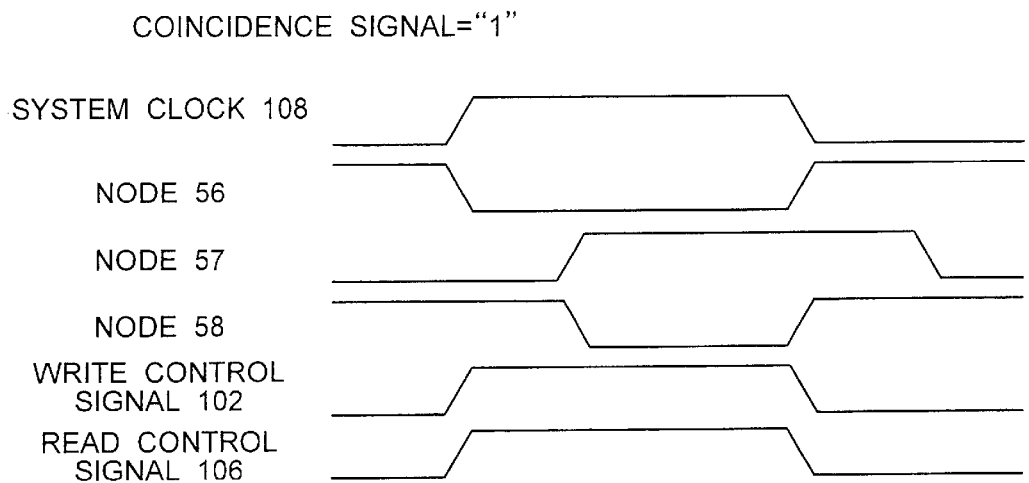
FIGS. 10A and 10B are timing charts of the SRAM having the timing section of FIG. 9, showing cases similar to the cases of FIGS. 8A and 8B, respectively.
Figure 10B:
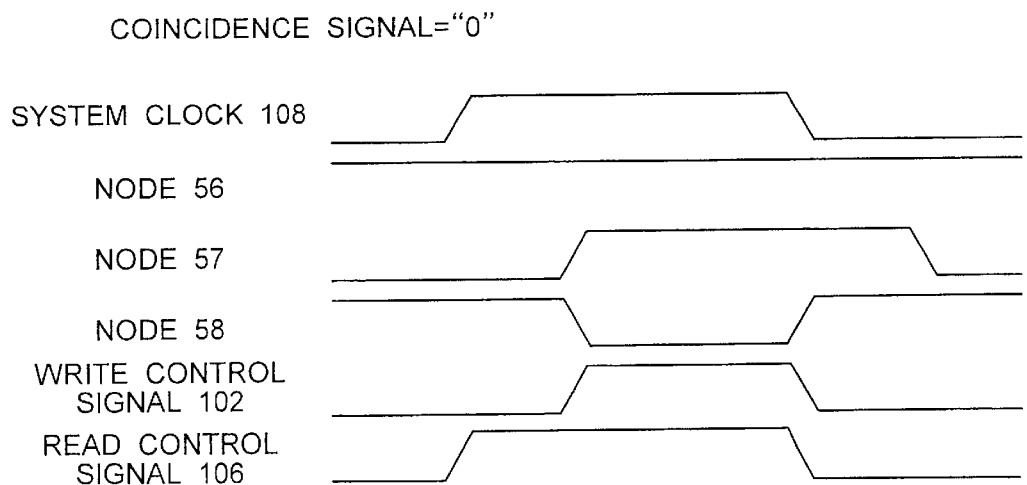

Referring to FIGS. 10A and 10B, the timing section of FIG. 9 delivers an improved write control signal 102, wherein the write control signal 102 assumes a low level immediately after the system clock signal 108 falls to a low level in both FIGS. 10A and 10B, with the other operations being substantially same as that of the first example. This enables the timing section 22A to operate at a higher speed, whereby the frequency of the system clock signal can be made higher.

Figure 11:
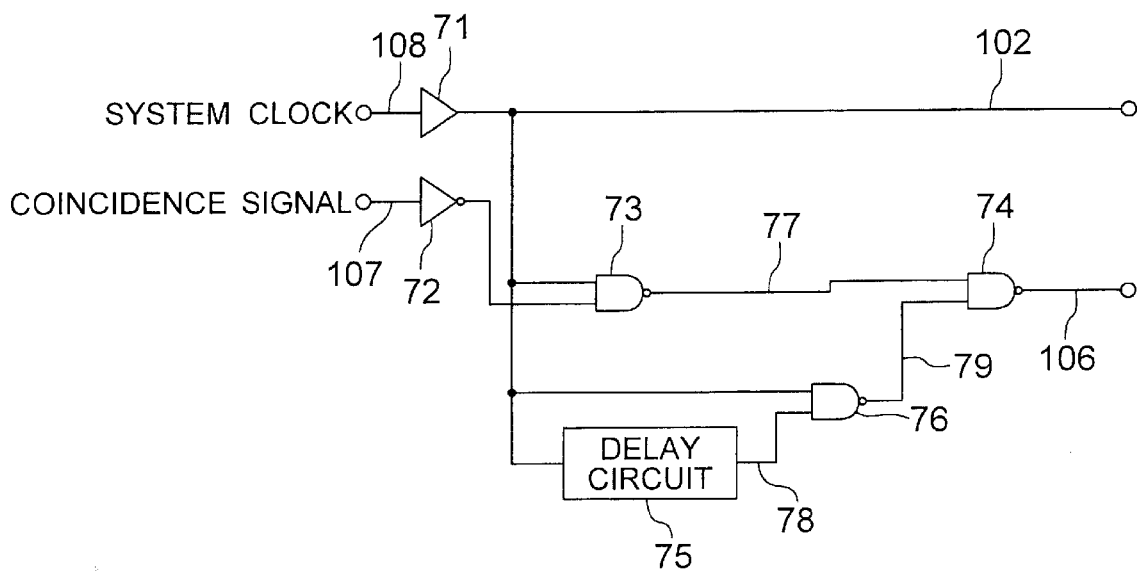
FIG. 11 is a circuit diagram of a third example of the timing section shown in FIG. 5.

Referring to FIG. 11, a third example of the timing section 22B includes a buffer 71 for receiving the system clock signal 108 to deliver a write control signal 102, an inverter 72 for receiving the coincidence signal 107, a first NAND gate 73 for receiving at the inputs thereof outputs from the buffer 71 and the inverter 72, a delay circuit 75 for receiving the system clock signal 108 to deliver a delayed clock signal, a second NAND gate 76 for receiving at the inputs thereof an output from the buffer 71 and the delayed clock signal, and a third NAND gate 74 for receiving at the inputs thereof outputs from the first NAND gate 73 and the second NAND gate 76 to deliver a read control signal 106.

Referring to FIGS. 12A and 12B, the third example of the timing chart delivers the write control signal 102 at the specified timing delayed from the rising edge of the system clock signal 108 irrespective of the coincidence or no coincidence of both the address signals, and delivers the read control signal 106 at the different timing between the cases of coincidence and no-coincidence. That is, the write control signal 102 is delivered at the timing of the rising edge of the system clock signal 108 upon no coincidence of both the address signals, and at the timing delayed from the rising edge of the system clock signal 108 and concurrently with the write control signal 102 upon coincidence of the address signals.

In the above embodiments, it was confirmed that the read time was 21 ns upon coincidence of both the address signals and was 22 $\mu$s upon no coincidence of both the address signals. On the other hand, in the conventional dual-port SRAM, the read time was 21 $\mu$s and 27 $\mu$s for the respective cases.

Since the above embodiments are described only for examples, the present invention is not limited to the above embodiments and various modifications or alterations can be easily made therefrom by those skilled in the art without departing from the scope of the present invention For example, the dual-port memory device of the present invention is not restricted to a SRAM and may be a DRAM or any other memory device so long as the memory device has dual ports. In addition, the circuit configurations shown in the drawings may be modified therefrom.

What is claimed is:

1. A multiple-port memory device comprising a memory cell array including a plurality of memory cells, an input circuit for responding to a write control signal to store a write data to one of said memory cells specified by a write address during a clock cycle of a system clock signal, an output circuit for responding to a read control signal to read a data from one of said memory cells specified by a read address during the same clock cycle, a coincidence detection section for generating a coincidence signal upon coincidence between the read address and the write address, a bypass circuit for responding to the coincidence signal to bypass the write data to said output circuit, and a timing circuit for responding to the coincidence signal to specify a timing between the write control signal and the read control signal, said timing being such that the read control signal leads with respect to the write control signal upon an absence of the coincidence signal and that the read control signal and the write control signal are generated substantially at the same time upon a presence of the coincidence signal.

2. The multiple-port memory device as defined in claim 1, wherein the read control signal is delivered at a fixed timing with respect to the system clock signal irrespective of the absence or presence of the coincidence signal.

3. The multiple-port memory device as defined in claim 1, wherein the write control signal is delivered at a fixed timing with respect to the system clock signal irrespective of the absence or presence of the coincidence signal.

4. The multiple-port memory device as defined in claim 1, wherein said input circuit and said output circuit sandwich said memory cell array therebetween.

5. The multiple-port memory device as defined in claim 1, wherein said multiple-port memory device is a dual-port memory device.

6. A method for controlling a multiple-port memory device comprising the steps of inputting a read address, a write address and a write data, reading a data from a memory cell specified by the read address by responding to a read control signal and storing the write data in a memory cell specified by the write data by responding to a write control signal in a clock cycle of a system clock signal, comparing the read address and the write address to detect a coincidence therebetween, controlling a timing between the write control signal and the read control signal based on a presence or an absence of the coincidence so that the write control signal and the read control signal are delivered at the same time upon the presence of the coincidence and that the write control signal is delayed with respect to the read control signal upon the absence of the coincidence.

7. The method as defined in claim 6, wherein the read control signal is delivered at a fixed timing with respect to the system clock signal irrespective of the presence or absence of the coincidence.

8. The method as defined in claim 6, wherein the write control signal is delivered at a fixed timing with respect to the system clock signal irrespective of the presence or absence of the coincidence.

* * * * *